US009385260B2

(12) United States Patent
Lin et al.

(10) Patent No.: US 9,385,260 B2
(45) Date of Patent: Jul. 5, 2016

(54) APPARATUS AND METHODS FOR FORMING THIN FILM SOLAR CELL MATERIALS

(71) Applicant: TSMC Solar Ltd., Taichung (TW)

(72) Inventors: Kwang-Ming Lin, Hsin-Chu (TW); Chi-Wei Liu, Yuanlin Township (TW); Wen-Cheng Kuo, Hemei Township (TW)

(73) Assignee: TSMC Solar Ltd., Taichung (TW)

( * ) Notice: Subject to any disclaimer, the term of this patent is extended or adjusted under 35 U.S.C. 154(b) by 0 days.

(21) Appl. No.: 13/938,288

(22) Filed: Jul. 10, 2013

(65) Prior Publication Data

US 2015/0017757 A1    Jan. 15, 2015

(51) Int. Cl.
*H01L 31/18*    (2006.01)
*H01L 31/032*    (2006.01)

(52) U.S. Cl.
CPC ............ *H01L 31/18* (2013.01); *H01L 31/0322* (2013.01); *Y02E 10/50* (2013.01); *Y02P 70/521* (2015.11)

(58) Field of Classification Search
CPC ..... H01L 31/0322; H01L 31/18; Y02E 10/50; Y02P 70/521
USPC .......................................................... 438/95
See application file for complete search history.

(56) References Cited

U.S. PATENT DOCUMENTS

| | | |
|---|---|---|
| 2006/0049334 A1 | 3/2006 | Henderson et al. |
| 2007/0116892 A1* | 5/2007 | Zwaap et al. ................. 427/587 |
| 2012/0178202 A1 | 7/2012 | Aslami |
| 2012/0318357 A1* | 12/2012 | Fujdala ............... H01L 31/0256 136/262 |
| 2013/0125797 A1* | 5/2013 | Hsiao et al. ............... 110/173 R |
| 2014/0360864 A1* | 12/2014 | Yen ......................... H01L 31/18 204/192.25 |

FOREIGN PATENT DOCUMENTS

| | | |
|---|---|---|
| EP | 1635470 A1 | 3/2006 |
| JP | 2013084664 A | 5/2013 |
| TW | 201112438 A1 | 4/2011 |

OTHER PUBLICATIONS

"Development of CIGS2 Thin Film Solar Cells" Authors by Neelkanth G. Dhere, Vivek S. Gade, Ankur A. Kadam, Anant H. Jahagirdar, Sachin S. Kulkarni, Sachin M. Bet from Material Science and Engineering B 116 (2005) 303-309.*

(Continued)

*Primary Examiner* — Bilkis Jahan
*Assistant Examiner* — Nga Doan
(74) *Attorney, Agent, or Firm* — Duane Morris LLP (57) ABSTRACT

A method for forming thin film solar cell materials introducing a first inert gas mixture that includes hydrogen selenide into a chamber at a first pressure value until the chamber reaches a second pressure value and at a first temperature value, wherein the second pressure value is a predefined percentage of the first pressure value. The temperature in the chamber is increased to a second temperature value for a selenization process so that the pressure in the chamber increases to a third pressure value. Residual gas that is generated during the selenization process can be removed from the chamber. A second inert gas mixture that includes hydrogen sulfide is added into the chamber until the chamber reaches a fourth pressure value. The temperature in the chamber is increased to a third temperature value for a sulfurization process. The chamber is cooled after the sulfurization process.

20 Claims, 8 Drawing Sheets

(56) References Cited

OTHER PUBLICATIONS

"A superstrate Solar Cell Based on In2(Se,S)3 and CuIn(Se,S)2 Thin Films Fabricated by Electrodeposition Combined with Annealing" Authors by Shigeru Ikeda, Ryo Kamai, Sun Min Lee, Tetsuro Yagi, Takashi Harada, Michio Matsumura, from Solar Energy Materials & Solar Cells in 2010 Elsevier.*

Toyama, T. et al., "A 17.7Mpixel 120fps CMOS Image Sensor with 34.8Gb/s Readout", 2011 IEEE International Solid-State Circuits Conference, ISSCC 2011/Session 23/ Image Sensors/ 23.11, pp. 420-422.

Yoshihara, S. et al., "A 1/1.8-inch 6.4 MPixel 60 frames/s CMOS Image Sensor with Seamless Mode Change", IEEE Journal of Solid-State Circuits, Dec. 2006, 41(12):2998-3006.

Lim, Y. et al., "A 1.1e Temporal Noise 1/3.2-inch 8Mpixel CMOS Image Sensor using Pseudo-Multiple Sampling", 2010 IEEE International Solid-State Circuits Conference, ISSCC 2010/ Session 22/ Image Sensors/ 22.2, pp. 396-398.

Official Action issued Nov. 26, 2015 in counterpart Taiwan patent application.

* cited by examiner

APPARATUS AND METHODS FOR FORMING THIN FILM SOLAR CELL MATERIALS

FIELD

The disclosure relates to solar cells and, more particularly, to an apparatus and method for forming thin film materials used for fabricating solar cells.

BACKGROUND

Photovoltaic cells or solar cells are photovoltaic components for direct generation of electrical current from sunlight. Due to the growing demand for clean sources of energy, the manufacture of solar cells has expanded dramatically in recent years and continues to expand. Various types of solar cells and solar cell substructures exist and continue to be developed. For example, solar cells include a substrate, a back contact layer on the substrate, an absorber layer on the back contact layer, a buffer layer on the absorber layer, and a front contact layer above the buffer layer. In some types of solar cells, the front contact layer can include a layer of transparent conductive oxide (TCO) material forming a window for light to pass through to the other layers below.

A plurality of solar cells are formed on one substrate, and are connected in series by respective interconnect structures in each solar cell to form a solar cell module. The absorber layer absorbs the sunlight that is converted into electrical current using the back contact layer. As such, semi-conductive materials are used in the manufacturing or fabrication of at least some known solar cells by being used as the material to form the absorber layer. More specifically, chalcopyrite based semi-conductive materials, such as copper indium gallium sulfur-selenide (CIGSS) (also known as thin film solar cell materials), are used to complete the formation of the absorber layer.

Some techniques that are used for the formation of CIGSS or thin film solar cell materials include a selenization process of metal precursors and a sulfurization process that is conducted after the selenization (the entire process is referred to as sulfurization after selenization (SAS)).

DETAILED DESCRIPTION

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

This description of the exemplary embodiments is intended to be read in connection with the accompanying drawings, which are to be considered part of the entire written description. The drawings are not drawn to scale. In the various drawings, like reference numerals indicate like items, unless expressly indicated otherwise in the text.

The exemplary apparatus and methods described herein overcome at least some disadvantages of other techniques that are used for the formation of chalcopyrite based thin film solar cell materials, such as copper indium gallium sulfur-selenide (CIGSS), by being able to save process gases during sulfurization after selenization (SAS). The embodiments described herein provide an apparatus and method that facilitate a cost-effective multi-step gas feeding process, wherein less gas is introduced into a process chamber, but the gas pressure can be increased pursuant to the ideal gas law. For example, as the temperature increases during the selenization process, the pressure of the hydrogen selenide gas increases. Similarly, as the temperature increases during the sulfurization process, the pressure of the hydrogen sulfide gas increases. Accordingly, the process gases are not wasted.

Figure 1:
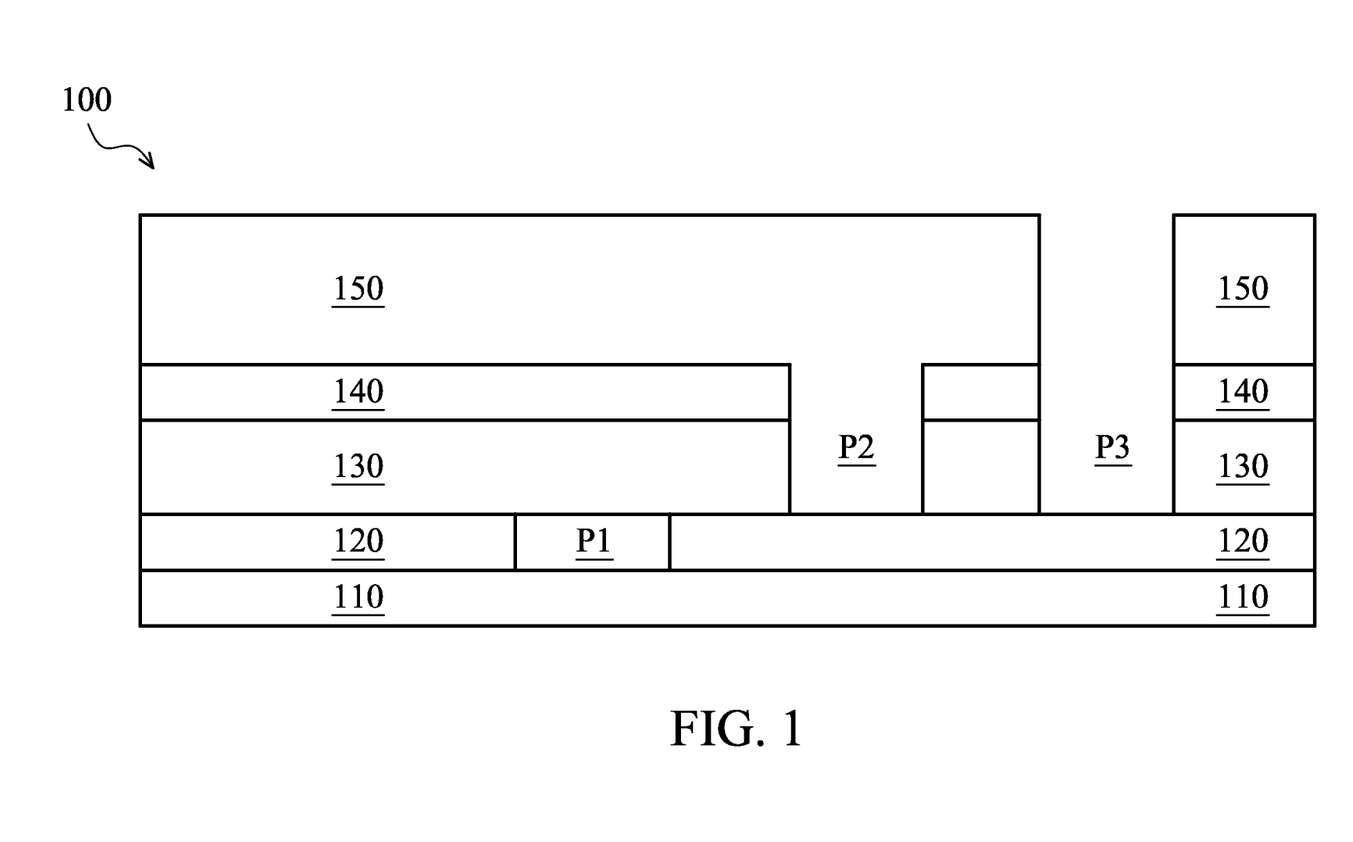
FIG. 1 is a cross-sectional view of an exemplary solar cell.

FIG. 1 illustrates a cross-section of a solar cell 100. Solar cell 100 includes a substrate 110, a back contact layer 120 formed onto substrate 110, an absorber layer 130 formed onto back contact layer 120, a buffer layer 140 formed onto absorber layer 130, and a front contact layer or transparent conductive oxide (TCO) layer 150 above buffer layer 140.

Substrate 110 includes any suitable substrate material, such as glass. In some embodiments, substrate 110 can include a glass substrate, such as soda lime glass, or a flexible metal foil or polymer (e.g., a polyimide, polyethylene terephthalate (PET), polyethylene naphthalene (PEN)). Other embodiments include still other substrate materials. Back contact layer 120 includes any suitable back contact material, such as metals. In some embodiments, back contact layer 120 can include molybdenum (Mo), platinum (Pt), gold (Au), silver (Ag), nickel (Ni), or copper (Cu). Other embodiments include still other back contact materials.

In some embodiments, absorber layer 130 includes any suitable absorber material, such as p-type semiconductors. In some embodiments, the absorber layer 130 can include a chalcopyrite-based material comprising Cu(In,Ga)Se2 (CIGS), cadmium telluride (CdTe), CuInSe2 (CIS), CuGaSe2 (CGS), Cu(In,Ga)Se2 (CIGS), Cu(In,Ga)(Se,S)2 (CIGSS), CdTe or amorphous silicon. Other embodiments include still other absorber materials.

Buffer layer 140 includes any suitable buffer material, such as n-type semiconductors. In some embodiments, buffer layer 140 can include cadmium sulphide (CdS), zinc sulphide (ZnS), zinc selenide (ZnSe), indium(III) sulfide (In2S3), indium selenide (In2Se3), or Zn1-xMgxO, (e.g., ZnO). Other embodiments include still other buffer materials.

In some embodiments, front contact layer 150 includes an annealed TCO layer. The TCO material for the annealed TCO layer can include any suitable front contact material, such as metal oxides and metal oxide precursors. In some embodiments, the TCO material can include zinc oxide (ZnO), cadmium oxide (CdO), indium oxide (In2O3), tin dioxide (SnO2), tantalum pentoxide (Ta2O5), gallium indium oxide (GaInO3), (CdSb2O3), or indium oxide (ITO). The TCO material can also be doped with a suitable dopant. In some embodiments, ZnO can be doped with any of aluminum (Al), gallium (Ga), boron (B), indium (In), yttrium (Y), scandium (Sc), fluorine (F), vanadium (V), silicon (Si), germanium (Ge), titanium (Ti), zirconium (Zr), hafnium (Hf), magnesium (Mg), arsenic (As), or hydrogen (H). In other embodiments, SnO2 can be doped with antimony (Sb), F, As, niobium (Nb), or tantalum (Ta). In other embodiments, In2O3 can be doped with tin (Sn), Mo, Ta, tungsten (W), Zr, F, Ge, Nb, Hf, or Mg. In other embodiments, CdO can be doped with In or Sn. In other embodiments, GaInO3 can be doped with Sn or Ge. In other embodiments, CdSb2O3 can be doped with Y. In other embodiments, ITO can be doped with Sn. Other embodiments include still other TCO materials and corresponding dopants.

Solar cell 100 also includes interconnect structures that include three scribe lines, referred to as P1, P2, and P3. The P1 scribe line extends through the back contact layer 120 and is filled with the absorber layer material. The P2 scribe line extends through the buffer layer 140 and the absorber layer 130 and is filled with the front contact layer material. The P3 scribe line extends through the front contact layer 150, buffer layer 140 and absorber layer 130.

Figure 2:
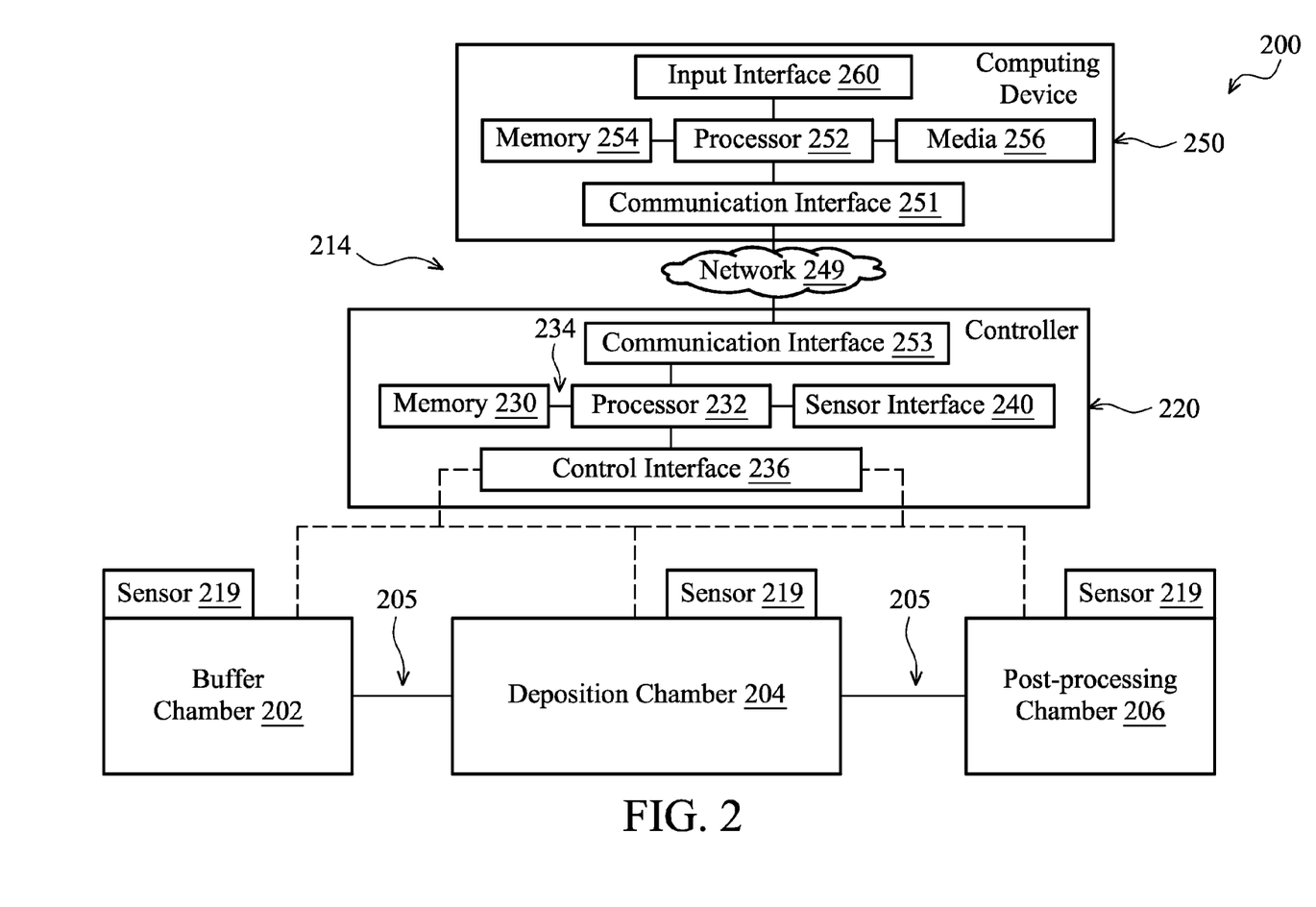
FIG. 2 is a block diagram of an exemplary apparatus used for forming thin film solar cell materials that are used to fabricate the solar cell shown in FIG. 1.

FIG. 2 is a block diagram of an exemplary apparatus 200 used for the formation of thin film solar cell materials, such as CIGSS, of absorber layer 130 (shown in FIG. 1) of solar cell 100 (shown in FIG. 1). In some embodiments, apparatus 200 includes a buffer chamber 202 that is configured to receive a substrate, such as substrate 110 (shown in FIG. 1), and to prepare substrate 110 therein for further processing. For example, buffer chamber 202 can include a vacuum source (not shown), a heater (not shown), and/or a heat exchanger (not shown) to facilitate providing heat energy to substrate 110, such that substrate is heated and ready to undergo further processing. A deposition chamber 204 is coupled to buffer chamber 202, via, for example, an endless conveyor 205, and deposition chamber 204 is configured to receive substrate 110 from buffer chamber 202 via endless conveyor 205. Although only one deposition 204 is shown in FIG. 2, system 200 can include any suitable number of deposition chambers 204 therein.

In some embodiments, deposition chamber 204 is configured to deposit layers, such as back contact layer 120 (shown in FIG. 1), buffer layer 140 (shown in FIG. 1), and/or absorber layer 130 (shown in FIG. 1), onto substrate 110 to form solar cell 100 or a substructure of solar cell 100. As such, deposition chamber 204 can include, for example, a vacuum pump or vacuum port (not shown), a heater (not shown), and/or a heat exchanger (not shown) to facilitate various deposition processes therein, such as sputtering and/or evaporation.

Apparatus 200 also includes a post-processing chamber 206 that is coupled to deposition chamber 204 via endless conveyor 205. In some embodiments, post-processing chamber 206 is configured to conduct a post-processing of the formed substructure, such as completing the formation of absorber layer 130. For example, post-processing chamber 206 can also include inert gases, such as nitrogen gas, argon, and helium, as well as hydrogen selenide and hydrogen sulfide such that post-processing chamber 206 can conduct a selenization process and a sulfurization process after the selenization process.

In some embodiments, a control system 214 is coupled to each of the chambers within apparatus 200, and control system 214 is configured to control various operational parameters, such as temperature and pressure, within each of the chambers. In some embodiments, control system 214 includes a controller 220 that is operatively coupled to vary the operation of apparatus 200 as a function of values determined from sensors responsive to parameters such as temperature and pressure, as well as rates of change of such parameters, according to a programmed control scheme or algorithm. For example, in some embodiments, controller 220 is coupled to at least one valve (not shown) in buffer chamber 202, at least one valve (not shown) in deposition chamber 204, and at least one valve (not shown) in post-processing chamber 206, for example. In some embodiments, controller 220 is enabled to facilitate operative features of each of the valves, via features that include, without limitation, receiving inputs, transmitting outputs, and transmitting opening and closing commands.

In some embodiments, controller 220 can be a real-time controller and can include any suitable processor-based or microprocessor-based system, such as a computer system, that includes microcontrollers, reduced instruction set circuits (RISC), application-specific integrated circuits (ASICs), logic circuits, and/or any other circuit or processor that is capable of executing the functions described herein. In one embodiment, controller 120 can be a microprocessor that includes read-only memory (ROM) and/or random access memory (RAM), such as, for example, a 32 bit microcomputer with 2 Mbit ROM and 64 Kbit RAM. As used herein, the term "real-time" refers to outcomes occurring in a substantially short period of time after a change in the inputs affect the outcome, with the time period being a design parameter that can be selected based on the importance of the outcome and/or the capability of the system processing the inputs to generate the outcome.

In some embodiments, controller 220 includes a memory device 230 that stores executable instructions and/or one or more operating parameters representing and/or indicating an operating condition of buffer chamber 202, deposition chamber 204, and post-processing chamber 206. Controller 220 also includes a processor 232 that is coupled to memory device 230 via a system bus 234. In some embodiments, processor 232 can include a processing unit, such as, without limitation, an integrated circuit (IC), an application specific integrated circuit (ASIC), a microcomputer, a programmable logic controller (PLC), and/or any other programmable circuit. Alternatively, processor 232 can include multiple processing units (e.g., in a multi-core configuration). The above examples are exemplary only, and thus are not intended to limit in any way the definition and/or meaning of the term "processor."

In some embodiments, controller 220 includes a control interface 236 that is coupled to buffer chamber 202, deposition chamber 204, and post-processing chamber 206. For example, control interface 236 is coupled to components, such as the valves within buffer chamber 202, deposition chamber 204, and post-processing chamber 206, and control interface 236 is configured to control an operation of the valves. For example, processor 232 can be programmed to generate one or more control parameters that are transmitted to control interface 236. Control interface 236 can then transmit a control parameter to modulate, open, or close the valves for example.

Various connection protocols are available between control interface 236 and buffer chamber 202, deposition chamber 204, and post-processing chamber 206. Such connection protocols can include, without limitation, an electrical conductor, a low-level serial data connection, such as Recommended Standard (RS) 232 or RS-485, a high-level serial data connection, such as USB, a field bus, a "PROFIBUS®," or Institute of Electrical and Electronics Engineers (IEEE) 1394 (a/k/a FIREWIRE), a parallel data connection, such as IEEE 1284 or IEEE 488, a short-range wireless communication channel (personal area network) such as "BLUETOOTH," and/or a private (e.g., inaccessible outside system) network connection, whether wired or wireless. "PROFIBUS" is a registered trademark of Profibus Trade Organization of Scottsdale, Ariz. IEEE is a registered trademark of the Institute of Electrical and Electronics Engineers, Inc., of New York, N.Y. "BLUETOOTH" is a registered trademark of Bluetooth SIG, Inc. of Kirkland, Wash.

In some embodiments, control system 214 also includes sensors 219 that are coupled to buffer chamber 202, deposition chamber 204, and post-processing chamber 206. For example, in some embodiments, controller 220 includes a sensor interface 240 that is communicatively coupled to sensors 219. In some embodiments, sensors 219 are configured to detect various operating parameters, such as temperature and/or pressure, within each of the buffer chamber 202, deposition chamber 204, and post-processing chamber 206. Sensors 219 each transmit a signal corresponding to their respective detected parameters to controller 220. Sensors 219 can each transmit a signal continuously, periodically, or only once, for example. In other embodiments, different bases are used for signal timings. Furthermore, sensors 219 can each transmit a signal either in an analog form or in a digital form. Various connections are available between sensor interface 240 and sensors 219. Such connections can include, without limitation, an electrical conductor, a low-level serial data connection, such as RS 232 or RS-485, a high-level serial data connection, such as USB or IEEE® 1394, a parallel data connection, such as IEEE® 1284 or IEEE® 488, a short-range wireless communication channel such as BLUETOOTH®, and/or a private (e.g., inaccessible outside system) network connection, whether wired or wireless.

Control system 214 can also include a user computing device 250 that is coupled to controller 220 via a network 249. For example, computing device 250 includes a communication interface 251 that is coupled to a communication interface 253 contained within controller 220. User computing device 250 includes a processor 252 for executing instructions. In some embodiments, executable instructions are stored in a memory device 254. Processor 252 can include one or more processing units (e.g., in a multi-core configuration). Memory device 254 is any device allowing information, such as executable instructions and/or other data, to be stored and retrieved. User computing device 250 also includes at least one media output component 256 for use in presenting information to a user. Media output component 256 is any component capable of conveying information to the user. Media output component 256 can include, without limitation, a display device (not shown) (e.g., a liquid crystal display (LCD), an organic light emitting diode (OLED) display, or an audio output device (e.g., a speaker or headphones)).

In some embodiments, user computing device 250 includes an input interface 260 for receiving input from a user. Input interface 260 can include, for example, a keyboard, a pointing device, a mouse, a stylus, a touch sensitive panel (e.g., a touch pad or a touch screen), a gyroscope, an accelerometer, a position detector, and/or an audio input device. A single component, such as a touch screen, can function as both an output device of media output component 256 and input interface 260.

During operation of apparatus 200, substrate 110 is delivered to buffer chamber 202, via endless conveyor 205, wherein substrate 110 is heated in preparation for further processing. Substrate 110 is conveyed on endless conveyor 205 from buffer chamber 202 to deposition chamber 204, wherein layers can be deposited onto substrate 110 via processes, such as sputtering and/or evaporation. For example, back contact layer 120 can be deposited onto substrate 110 and absorber layer 130 can then be formed onto back contact layer 120. The substructure formed in deposition chamber 204 is then conveyed on endless conveyor 205 from deposition chamber 204 to post-processing chamber 206, wherein the absorber formation is completed by undergoing SAS.

As explained in more detail below with respect to FIGS. 3-8, when undergoing SAS, post-processing chamber 206 conducts a multi-step gas feeding process for the formation of thin film solar cell materials, such as CIGSS, of absorber layer 130. In some embodiments, an inert gas mixture that includes hydrogen selenide and inert gases, such as nitrogen gas, argon, and/or helium, is introduced into post-processing chamber 206 for the selenization process. As the temperature within post-processing chamber 206 is increased for the selenization process, the temperature of the gas increases and the pressure of the gas increases pursuant to the ideal gas law identified by Equation 1 below.

$$PV=nRT \qquad \text{Eq. 1}$$

In Equation 1, P is the pressure of the gas, such as the pressure of hydrogen selenide or hydrogen sulfide, V is the volume of the gas, n is the amount of substance of gas (i.e., the number of moles), T is the absolute temperature of the gas in Kelvin, and R is the ideal, or universal, gas constant, which has a value of 8.314 J/((K)(mol)) or 0.08206 ((L)(atm))/((mol)(K)). Pursuant to the ideal gas law, pressure and temperature are directly related. As such, as the temperature of hydrogen selenide and/or the inert gases increase for selenization at constant volume, the pressure of hydrogen selenide and/or the inert gases increases. Similarly, an inert gas mixture including hydrogen sulfide and inert gases is introduced into deposition chamber for the sulfurization process and as the temperature is increased during the sulfurization process, the pressure increases. As such, process gases are not wasted.

Figure 3:
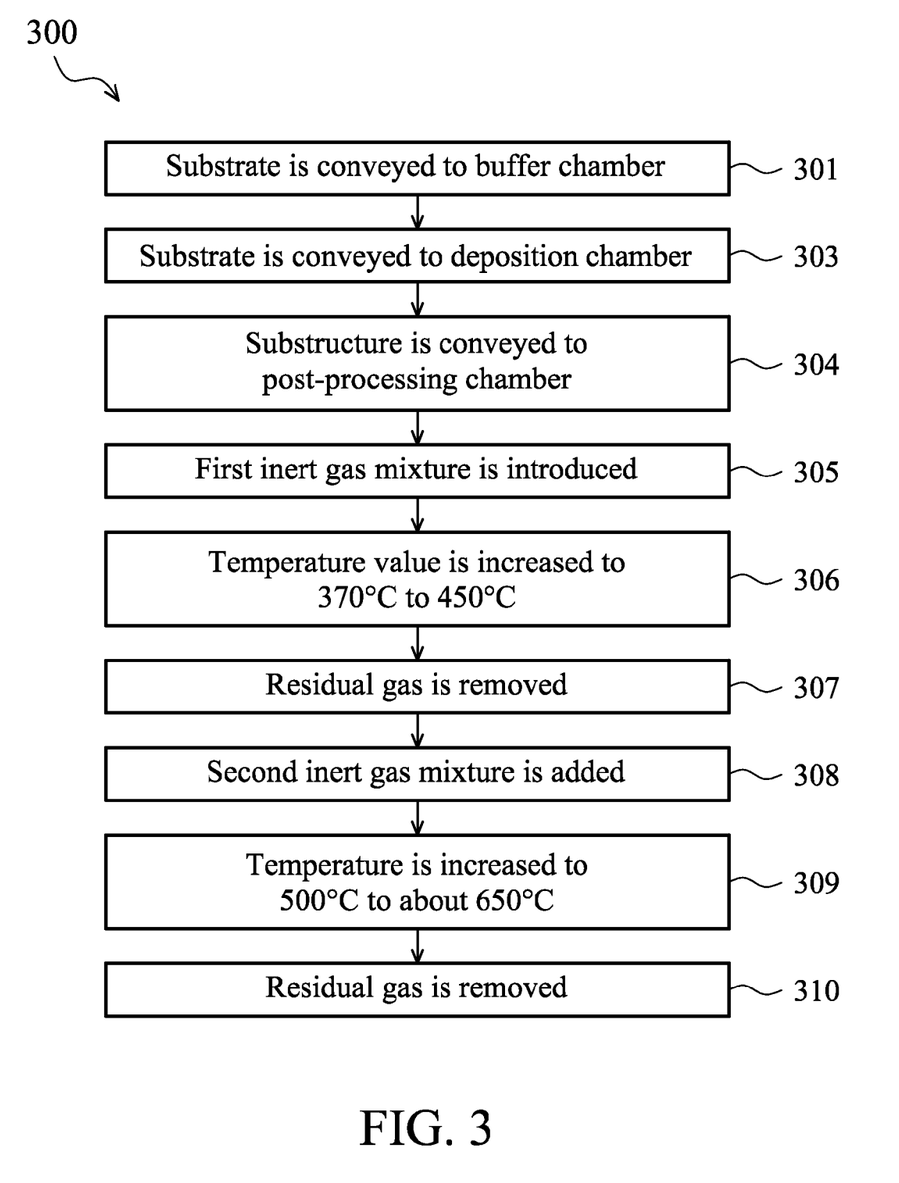
FIG. 3 is a flow diagram of an exemplary method for forming the thin film solar cell materials using the apparatus shown in FIG. 2.
Figure 4:
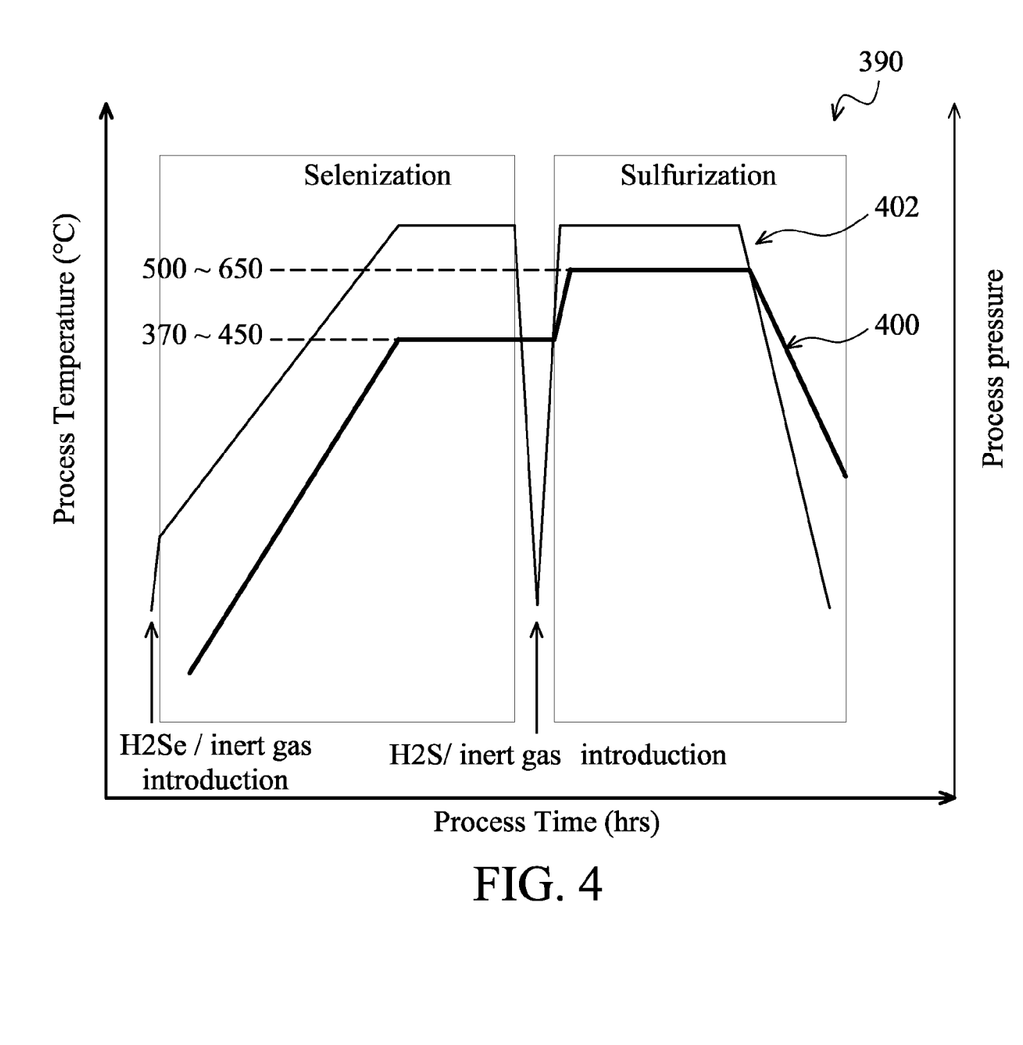
FIG. 4 is a graphical representation of the method shown in FIG. 3.

FIG. 3 is a flow diagram 300 of an exemplary method for forming the thin film solar cell materials of absorber layer 130 (shown in FIG. 1) using apparatus 200 (shown in FIG. 2).). FIG. 4 illustrates a graphical representation 390 of a temperature (° C.) (curve 400) and a pressure (torr) (curve 402) profile of the method as it relates to process time (hours). Referring to FIG. 3, in step 301, substrate 110 (shown in FIG. 1) is delivered to buffer chamber 202 (shown in FIG. 2), via endless conveyor 205 (shown in FIG. 2), wherein substrate 110 is heated in preparation for further processing.

In step 303, substrate 110 is conveyed on endless conveyor 205 from buffer chamber 202 to deposition chamber 204 (shown in FIG. 2), wherein layer materials can be deposited onto substrate 110 to form layers on substrate 110 via processes, such as sputtering and/or evaporation. For example, back contact layer material can be deposited onto substrate 110 to form back contact layer 120 (shown in FIG. 1) and absorber layer 130 is formed onto back contact layer 120 to form a substructure.

In step 304, the substructure is conveyed on endless conveyor 205 from deposition chamber 204 to post-processing chamber 206 (shown in FIG. 2), wherein the absorber layer 130 formation is completed by undergoing SAS. For example, referring to FIGS. 3 and 4, in step 305, a first inert gas mixture that includes hydrogen selenide and inert gases, such as nitrogen gas, argon, and helium, is introduced into post-processing chamber 204 at room temperature and at vacuum (in a range of from about $10^{-1}$ torr to about $10^{-4}$ torr) until the chamber pressure reaches 20-80% of the base pressure, which is equivalent to a pressure value in the range of about 130 torr to 520 torr. In some embodiments, the first inert gas mixture includes hydrogen selenide and inert gases at a ratio of approximately 4% to 20%. In some embodiments, the first inert gas mixture is introduced incrementally as the pressure is increased from vacuum (in a range of from about $10^{-1}$ torr to about $10^{-4}$ torr) to a pressure value in the range of about 130 torr to 520 torr.

In some embodiments, the pressure can be varied by a user. For example, a user can initially input a pressure value for post-processing chamber 206. The value can be programmed with user computing device 250 (shown in FIG. 2) and/or controller 220 (shown in FIG. 2). The user can later manually change the pressure by programming the new value into user computing device 250 and/or controller 220. Then controller 220 will transmit a control parameter to, for example, the valve within post-processing chamber 206 such that the pressure within post-processing chamber 206 can change. Alternatively, apparatus 200 can also automatically adjust the pressure within post-processing chamber 206. For example, sensor 219 (shown in FIG. 2), which is positioned on post-processing chamber 206, can detect the pressure value within chamber 206 and transmit at least one signal representative of the detected value to controller 220. Depending on whether the detected value is less than, greater than, or equal to a programmed threshold value, controller 220 can transmit a control parameter to post-processing chamber 206 to adjust the pressure such that the programmed value can be obtained.

In step 306, the chamber temperature is increased from room temperature (~293 K) to a temperature value in the range of about 370° C. (642 K) to about 450° C. (722 K) for the selenization process. When the temperature increases, then according to the ideal gas law (shown in Equation 1 above), the pressure of the gases (i.e., the hydrogen selenide and/or the inert gases) increases from 2.19 times to 2.47 times. Thus the pressure reaches from 1285 torr to 2847 torr. In some embodiments, the temperature can be changed by a user. For example, a user can initially input a temperature value for post-processing chamber 206. The value can be programmed with user computing device 250 and/or controller 220. The user can later manually change the temperature by programming the new value into user computing device 250 and/or controller 220. Then controller 220 will transmit a control parameter to post-processing chamber 206 such that the temperature within post-processing chamber 206 can change. Alternatively, apparatus 200 can also automatically adjust the temperature within post-processing chamber 206. For example, sensor 219, which is positioned on post-processing chamber 206, can detect the temperature value within chamber 206 and transmit at least one signal representative of the detected value to controller 220. Depending on whether the detected value is less than, greater than, or equal to a programmed threshold value, controller 220 can transmit a control parameter to post-processing chamber 206 to adjust the temperature such that the programmed value can be obtained.

In step 307, residual gas generated during the selenization process is removed from chamber 206 until the increased pressure is substantially reduced to a pressure value that is less than 150 torr. As such, the process gases cannot be wasted.

In step 308, a second inert gas mixture that includes hydrogen sulfide and inert gases, such as nitrogen gas, argon, and/or helium, is added to post-processing chamber 206 until chamber 206 reaches a pressure value in the range of about 200 torr to about 600 torr. In some embodiments, the second inert gas mixture includes hydrogen sulfide and inert gases at a ratio of approximately 5% to 60%. In some embodiments, the second inert gas is introduced in increments, such as every 15 minutes, as the pressure is increased to a value in the range of about 200 torr to about 600 torr. In step 309, the temperature in chamber 206 is increased to a temperature value in the range of about 500° C. to about 650° C. for the sulfurization process.

In step 310, the temperature in chamber 206 is reduced to less than 450° C. In step 311, residual gas generated during the sulfurization process is removed from chamber 206 until the increased pressure is substantially reduced.

Figure 5:
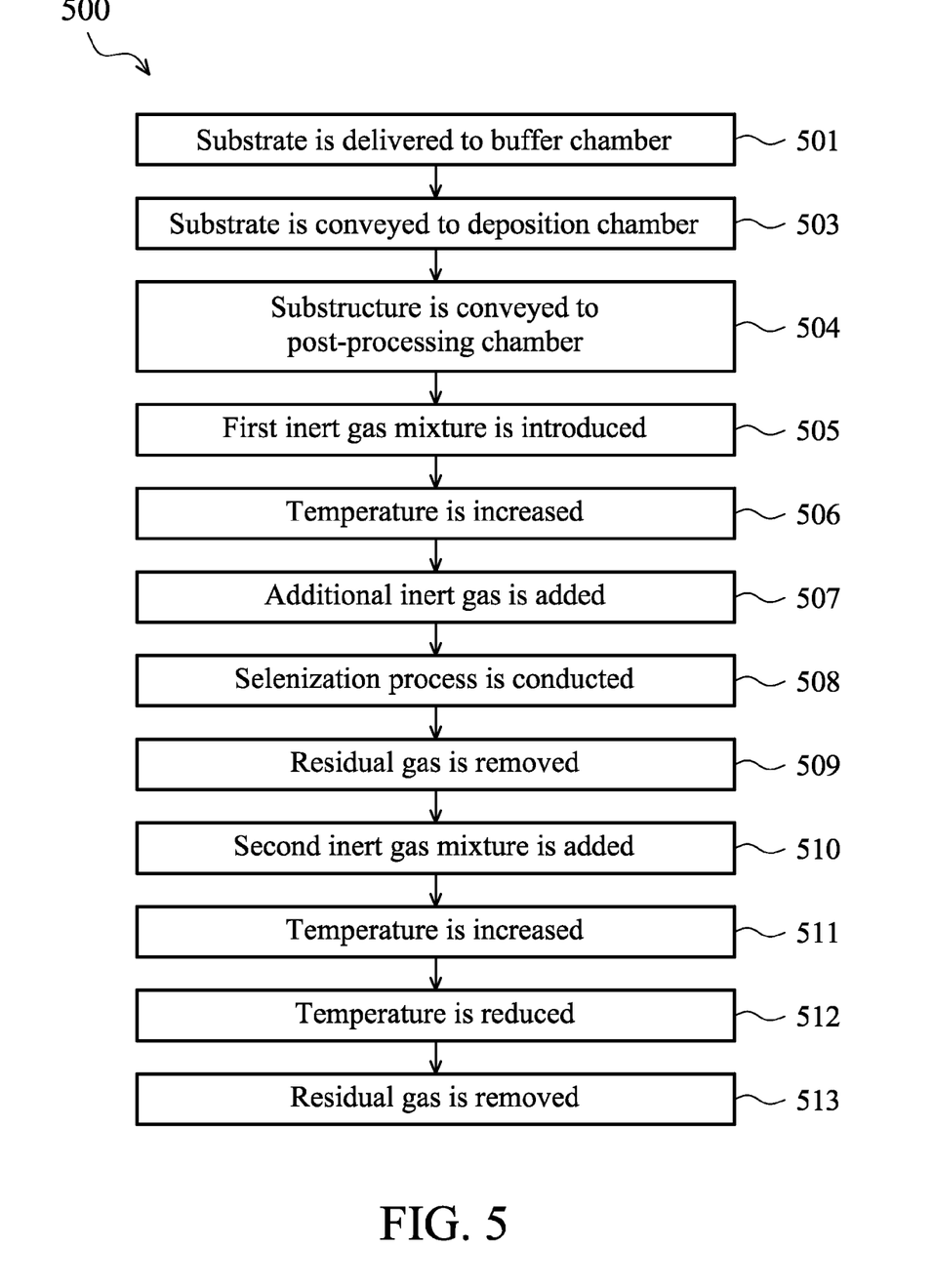
FIG. 5 is a flow diagram of an alternative method for forming the thin film solar cell materials using the apparatus shown in FIG. 2.
Figure 6:
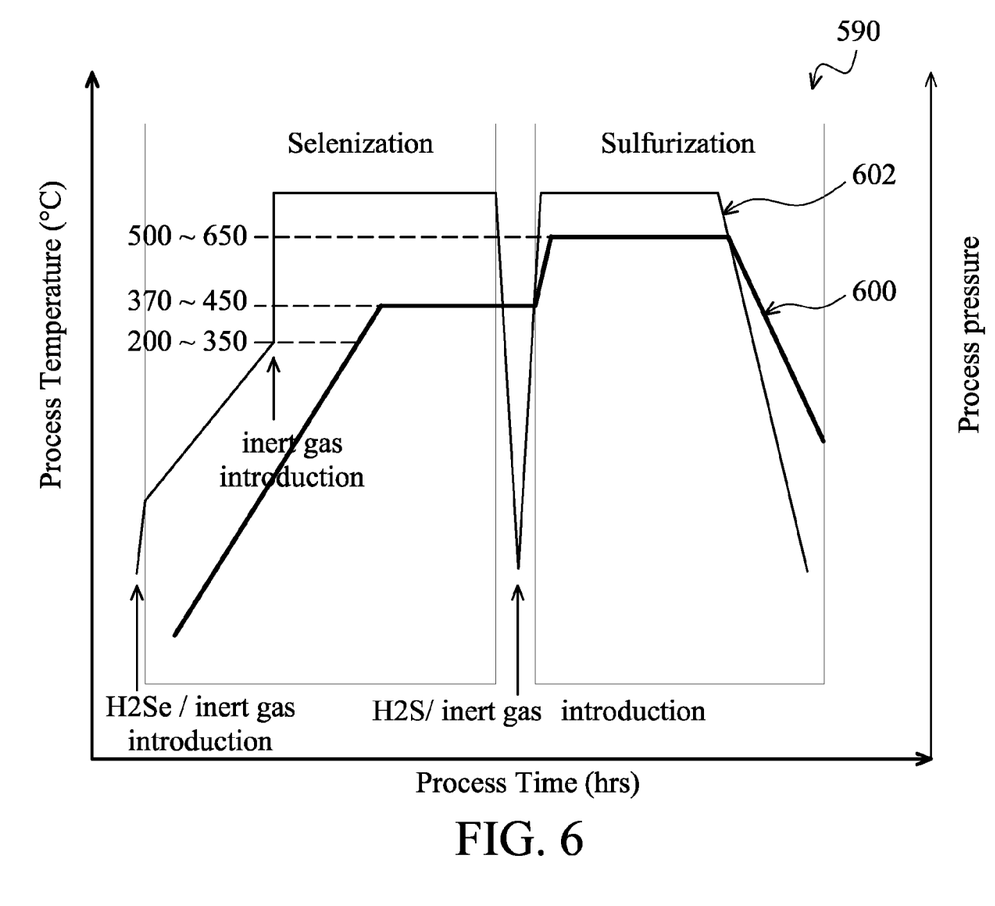
FIG. 6 is a graphical representation of the method shown in FIG. 5

FIG. 5 is a flow diagram 500 of an alternative method for forming the thin film solar cell materials of absorber layer 130 (shown in FIG. 1) using apparatus 200 (shown in FIG. 2) that can be used in place of the method shown in flow diagram 300 (shown in FIG. 3). FIG. 6 illustrates a graphical representation 590 of a temperature (° C.) (curve 600) and pressure profile (torr) (curve 602) of the method of flow diagram 500 as it relates to process time (hours). Referring to FIG. 5, in step 501, substrate 110 (shown in FIG. 1) is delivered to buffer chamber 202 (shown in FIG. 2), via endless conveyor 205 (shown in FIG. 2), wherein substrate 110 is heated in preparation for further processing.

In step 503, substrate 110 is conveyed on endless conveyor 205 from buffer chamber 202 to deposition chamber 204 (shown in FIG. 2), wherein layer materials can be deposited onto substrate 110 to form layers on substrate 110 via processes, such as sputtering and/or evaporation. For example, back contact layer material can be deposited onto substrate 110 to form back contact layer 120 (shown in FIG. 1) and absorber layer 130 is formed onto back contact layer 120 to form a substructure.

In step 504, the substructure is conveyed on endless conveyor 205 from deposition chamber 204 to post-processing chamber 206 (shown in FIG. 2), wherein the absorber formation is completed by undergoing SAS. For example, referring to FIGS. 5 and 6, in step 505, a first inert gas mixture that includes hydrogen selenide and inert gases, such as nitrogen gas, argon, and helium, is introduced into post-processing chamber 204 at room temperature and at vacuum (in a range of from about $10^{-1}$ torr to about $10^{-4}$ torr) until the chamber pressure reaches a values that is 20-80% of the base pressure, which is equivalent to a pressure value in the range of about 130 torr to 520 torr. In some embodiments, the first inert gas mixture includes hydrogen selenide and inert gases at a ratio of approximately 4% to 20%. In some embodiments, the first inert gas mixture is introduced in increments as the pressure is increased from vacuum (in a range of from about $10^{-1}$ torr to about $10^{-4}$ torr) to a pressure value in the range of about 130 torr to 520 torr.

In some embodiments, the pressure and/or temperature can be varied by a user. For example, a user can initially input a pressure value and/or temperature value for post-processing chamber 206. The value can be programmed with user computing device 250 (shown in FIG. 2) and/or controller 220 (shown in FIG. 2). The user can later manually change the pressure and/or temperature value by programming the new value into user computing device 250 and/or controller 220. Then controller 220 will transmit a control parameter to, for example, the valve within post-processing chamber 206 such that the pressure and/or temperature within post-processing chamber 206 can change. Alternatively, apparatus 200 can also automatically adjust the pressure and/or temperature within post-processing chamber 206. For example, sensor 219 (shown in FIG. 2), which is positioned on post-processing chamber 206, can detect the pressure value and/or the temperature value within chamber 206 and transmit at least one signal representative of the detected value to controller 220. Depending on whether the detected value is less than, greater than, or equal to a programmed threshold value, controller 220 can transmit a control parameter to post-processing chamber 206 to adjust the pressure and/or the temperature such that the programmed value can be obtained.

In step 506, the temperature in chamber 206 is increased such that the temperature therein cab be in the range of about 370° C. to 450° C., which is the goal temperature to reach for the selenization process. When the temperature increases to a value of half of the difference between the current temperature and the goal temperature, then in step 507, additional inert gas is added to post-processing chamber 206 until a desired pressure is obtained. When the goal temperature is reached, then in step 508, the selenization process is conducted. When the temperature increases, then according to the ideal gas law (shown in Equation 1 above), the pressure of the gases (i.e., the hydrogen selenide and/or the inert gases) increases.

In step 509, residual gas generated during the selenization process is removed from chamber 206 until the increased pressure is substantially reduced to a pressure value that is less than 150 torr.

In step 510, a second inert gas mixture that includes hydrogen sulfide and inert gases, such as nitrogen gas, argon, and/or helium, is added to post-processing chamber 206 until chamber 206 reaches a pressure value in the range of about 200 torr to about 600 torr. In some embodiments, the second inert gas mixture includes hydrogen sulfide and inert gases at a ratio of approximately 5% to 60%. In some embodiments, the second inert gas is introduced in increments as the pressure is increased to a value in the range of about 200 torr to 600 torr. In step 511, the temperature is increased to a temperature value in the range of about 500° C. to about 650° C. for the sulfurization process. When the temperature increases, then according to the ideal gas law (shown in Equation 1 above), the pressure of the gases (i.e., the hydrogen sulfide and/or the inert gases) increases.

In step 512, the temperature in chamber 206 is reduced to less than 450° C. In step 513, residual gas generated during the sulfurization process is removed from chamber 206 until the increased pressure is substantially reduced.

Figure 7:
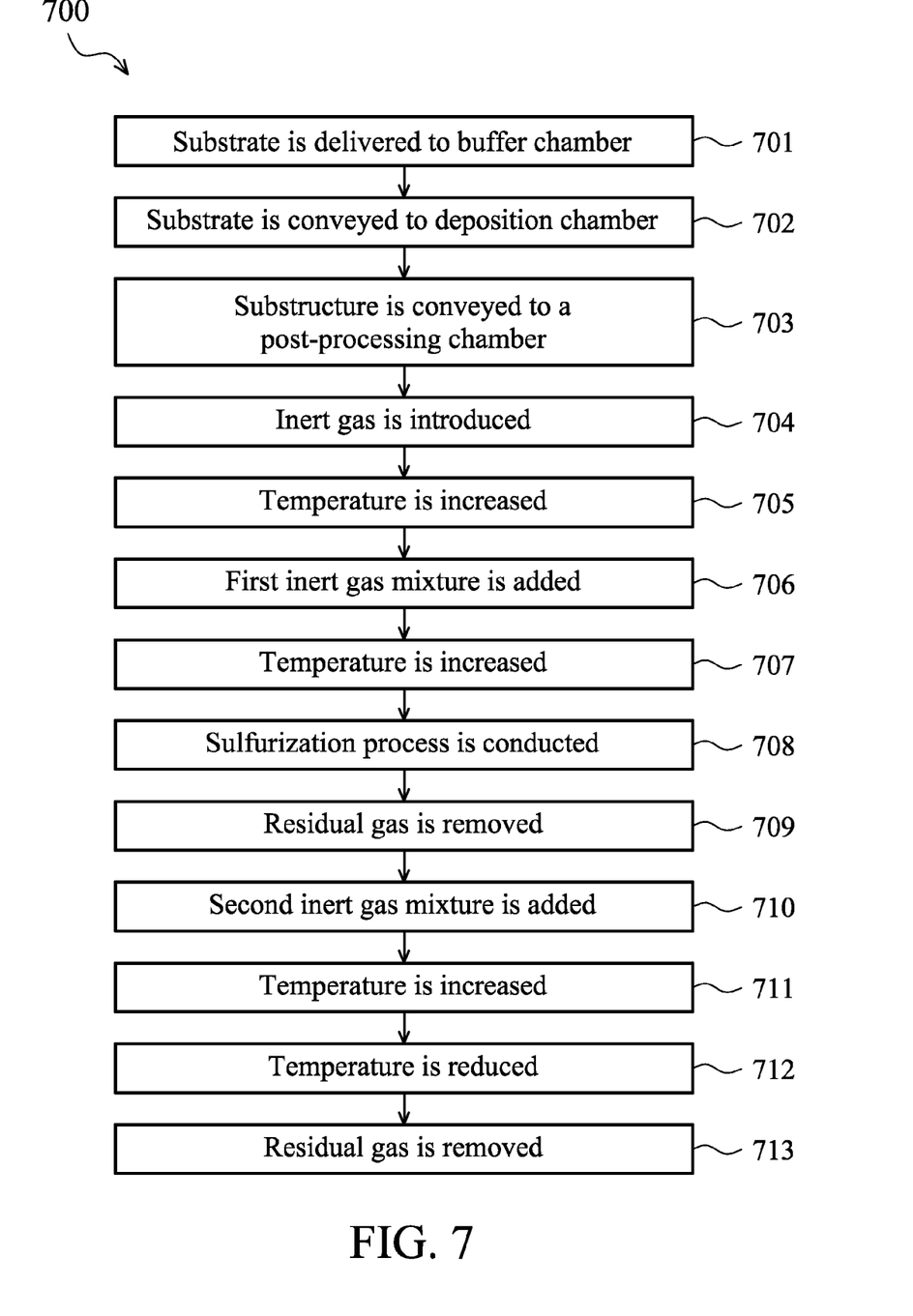
FIG. 7 is a flow diagram of another alternative method for forming the thin film solar cell materials using the apparatus shown in FIG. 2.
Figure 8:
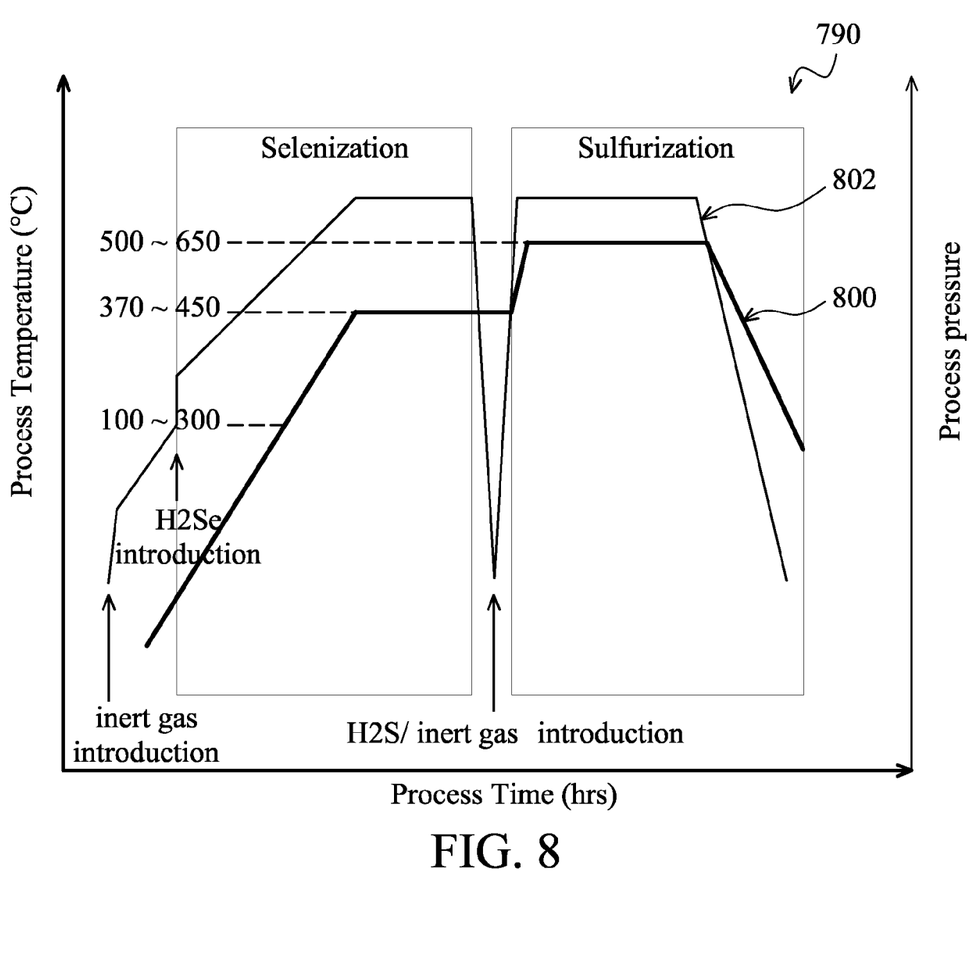
FIG. 8 is a graphical representation of the method shown in FIG. 7.

FIG. 7 is a flow diagram 700 of an alternative method for forming the thin film solar cell materials of absorber layer 130 (shown in FIG. 1) using apparatus 200 (shown in FIG. 2).) that can be used in place of the method shown in flow diagram 300 (shown in FIG. 3). FIG. 8 illustrates a graphical representation 790 of a temperature (° C.) (curve 800) and pressure profile (torr) (curve 802) of the method of flow diagram 700 as it relates to process time (hours). Referring to FIG. 7, in step 701, substrate 110 (shown in FIG. 1) is delivered to buffer chamber 202 (shown in FIG. 2), via endless conveyor 205 (shown in FIG. 2), wherein substrate 110 is heated in preparation for further processing.

In step 702, substrate 110 is conveyed on endless conveyor 205 from buffer chamber 202 to deposition chamber 204 (shown in FIG. 2), wherein layer materials can be deposited onto substrate 110 to form layers on substrate 110 via processes, such as sputtering and/or evaporation. For example, back contact layer material can be deposited onto substrate 110 to form back contact layer 120 (shown in FIG. 1) and absorber layer 130 is formed onto back contact layer 120 to form a substructure.

In step 703, the substructure is conveyed on endless conveyor 205 from deposition chamber 204 to post-processing chamber 206 (shown in FIG. 2), wherein the absorber formation is completed by undergoing SAS. For example, referring to FIGS. 7 and 8, in step 704, an inert gas, such as nitrogen gas, argon, and helium, is introduced into post-processing chamber 204 at room temperature and at vacuum (in a range of from about $10^{-1}$ torr to about $10^{-4}$ torr) to a pressure value in the range of about 100 torr to 350 torr. In some embodiments, the inert gas is introduced into chamber 206 in increments as the pressure is increased from vacuum (in a range of from about $10^{-1}$ torr to about $10^{-4}$ torr) to a pressure value in the range of about 100 torr to 350 torr.

In step 705, the room temperature is increased such that the room temperature value can be in the range of about 370° C. to 450° C., which is the goal temperature to reach for the selenization process. When the temperature increases to a value of half of the difference between the current temperature and the goal temperature, then in step 706, a first inert gas mixture that includes hydrogen selenide and inert gases, such as nitrogen gas, argon, and helium, is added into post-processing chamber 206. In some embodiments, the first inert gas mixture includes hydrogen selenide and inert gases at a ratio of approximately 4% to 20%.

In some embodiments, the pressure and/or temperature can be varied by a user. For example, a user can initially input a pressure value and/or temperature value for post-processing chamber 206. The value can be programmed with user computing device 250 (shown in FIG. 2) and/or controller 220 (shown in FIG. 2). The user can later manually change the pressure and/or temperature value by programming the new value into user computing device 250 and/or controller 220. Then controller 220 will transmit a control parameter to, for example, the valve within post-processing chamber 206 such that the pressure and/or temperature within post-processing chamber 206 can change. Alternatively, apparatus 200 can also automatically adjust the pressure and/or temperature within post-processing chamber 206. For example, sensor 219 (shown in FIG. 2), which is positioned on post-processing chamber 206, can detect the pressure value and/or the temperature value within chamber 206 and transmit at least one signal representative of the detected value to controller 220. Depending on whether the detected value is less than, greater than, or equal to a programmed threshold value, controller 220 can transmit a control parameter to post-processing chamber 206 to adjust the pressure and/or the temperature such that the programmed value can be obtained.

In step 707, the temperature in chamber 206 is increased to the temperature value in the range of about 370° C. to 450° C. In step 708, the selenization process is conducted. When the temperature increases, then according to the ideal gas law (shown in Equation 1 above), the pressure of the gases (i.e., the hydrogen selenide and/or the inert gases) increases.

In step 709, residual gas generated during the selenization process is removed from chamber 206 until the increased pressure is substantially reduced to a pressure value that is less than 150 torr.

In step 710, a second inert gas mixture that includes hydrogen sulfide and inert gases, such as nitrogen gas, argon, and/or helium, is added to post-processing chamber 206 until chamber 206 reaches a pressure value in the range of about 200 torr to about 600 torr. In some embodiments, the second inert gas mixture includes hydrogen sulfide and inert gases at a ratio of approximately 5% to 60%. In some embodiments, the second inert gas is introduced in increments as the pressure is increased to a pressure value in the range of about 200 torr to about 600 torr. In step 711, the temperature in chamber 206 is increased to a temperature value in the range of about 500° C. to about 650° C. for the sulfurization process. When the temperature increases, then according to the ideal gas law, the pressure of the gases (i.e., the hydrogen sulfide and/or the inert gases) increases.

In step 712, the temperature in chamber 206 is reduced to less than 450° C. In step 713, residual gas generated during the sulfurization process is removed from chamber 206 until the increased pressure is substantially reduced.

Some embodiments described herein provide an apparatus and methods that facilitate a cost-effective multi-step gas feeding process, wherein less gas is introduced into the process chamber and the pressure is increased following the ideal gas law. For example, as the temperature increases during the selenization process, the pressure of the hydrogen selenide gas increases. Similarly, as the temperature increases during the sulfurization process, the pressure of the hydrogen sulfide gas increases. Accordingly, the process gases cannot be wasted.

In some embodiments, a method for forming thin film solar cell materials is provided and introducing a first inert gas mixture that includes hydrogen selenide into a chamber at a first pressure value until the chamber reaches a second pressure value and at a first temperature value, wherein the second pressure value is a predefined percentage of the first pressure value. The temperature in the chamber is increased to a second temperature value for a selenization process so that the pressure in the chamber increases to a third pressure value. Residual gas that is generated during the selenization process can be removed from the chamber. A second inert gas mixture that includes hydrogen sulfide is added into the chamber until the chamber reaches a fourth pressure value. The temperature in the chamber is increased to a third temperature value for a sulfurization process. The chamber is cooled after the sulfurization process.

In some embodiments, an apparatus for forming thin film solar cell materials includes at least one post-processing chamber coupled to receive a solar cell substructure from at least one deposition chamber. A controller is coupled to the post-processing chamber, wherein the controller is configured to enable the forming of thin solar cell materials onto the solar cell substructure within the post-processing chamber by being configured to introduce a first inert gas mixture that includes hydrogen selenide into the post-processing chamber at a first pressure value until the post-processing chamber reaches a second pressure value and at a first temperature value, wherein the second pressure value is a predefined percentage of the first pressure value. The controller is configured to increase the temperature in the post-processing chamber to a second temperature value for a selenization process so that the pressure in the post-processing chamber increases to a third pressure value. The controller is configured to remove residual gas generated during the selenization process from the post-processing chamber. The controller is further configured to add a second inert gas mixture that includes hydrogen sulfide into the post-processing chamber until the post-processing chamber reaches a fourth pressure value. The controller is also configured to increase the temperature in the post-processing chamber to a third temperature value for a sulfurization process and to cool the post-processing chamber after the sulfurization process.

In some embodiments, a method for forming thin film solar cell materials includes introducing an inert gas into a chamber at a first pressure value until the chamber reaches a second pressure value and at a first temperature value. The temperature in the chamber is increased to a value of half of the difference between a current temperature value and a second temperature value, A first inert gas mixture that includes hydrogen selenide is added into the chamber when the value of half of the difference between the current temperature value and the second temperature value is reached. The temperature in the chamber is increased to the second temperature value for a selenization process so that the pressure in the chamber increases to a third pressure value. Residual gas generated during the selenization process can be removed from the chamber. A second inert gas mixture that includes hydrogen sulfide is added into the chamber until the chamber reaches a fourth pressure value. The temperature in the chamber is increased to a third temperature value for a sulfurization process. The chamber is cooled after the sulfurization process.

Although the apparatus and method described herein have been described in terms of exemplary embodiments, they are not limited thereto. Rather, the appended claims should be construed broadly, to include other variants and embodiments of the disclosed system and method, which can be made by those skilled in the art without departing from the scope and range of equivalents of the system and method.

What is claimed is:

1. A method for forming thin film solar cell materials, said method comprising, in order:
introducing a first inert gas mixture that includes hydrogen selenide into a single chamber at a first pressure value until the single chamber reaches a second pressure value and at a first temperature value;
increasing the temperature in the single chamber to a second temperature value so that the pressure in the chamber increases to a third pressure value;
performing a selenization process in the single chamber at the second temperature and third pressure;
adding a second inert gas mixture that includes hydrogen sulfide into the same single chamber until the single chamber reaches a fourth pressure value;
increasing the temperature in the single chamber to a third temperature value; and
performing a sulfurization process at the fourth pressure and third temperature in the same single chamber.

2. The method of claim 1, further comprising removing a residual gas generated during the sulfurization.

3. The method of claim 1, further comprising adding inert gas into the chamber when the temperature in the chamber is increased to a value of half of the difference between a current temperature value and the second temperature value.

4. The method of claim 1, wherein introducing a first inert gas mixture comprises introducing a first inert gas mixture that includes hydrogen selenide into the single chamber at a first pressure value in a range of from about $10^{-1}$ torr to about $10^{-4}$ torr until the single chamber reaches a second pressure value in a range of from about 130 torr to about 520 torr.

5. The method of claim 1, wherein increasing the temperature in the single chamber to a second temperature value comprises increasing the temperature in the single chamber to a second temperature value in the range of from about 370° C. to about 450° C.

6. The method of claim 1, wherein adding the second inert gas mixture comprises adding a mixture that includes hydrogen sulfide into the single chamber until the single chamber reaches a pressure in the range of from about 200 torr to about 600 torr.

7. The method of claim 1, wherein increasing the temperature in the single chamber to the third temperature value comprises increasing the temperature in the single chamber to a temperature in the range of from about 500° C. to about 650° C.

8. An apparatus for forming thin film solar cell materials, said apparatus comprising:
- a single post-processing chamber coupled to receive a solar cell substructure from single deposition chamber; and
- a controller coupled to said single post-processing chamber, wherein said controller is configured to enable the forming of thin solar cell materials onto the solar cell substructure within said single post-processing chamber by being configured to:
  - introduce a first inert gas mixture that includes hydrogen selenide into said single post-processing chamber at a first pressure value until said single post-processing chamber reaches a second pressure value and a first temperature value;
  - increase the temperature in said single post-processing chamber to a second temperature value so that the pressure in said single post-processing chamber increases to a third pressure value;
  - perform a selenization process in said single post-processing chamber at the second temperature value and third pressure value;
  - add a second inert gas mixture that includes hydrogen sulfide into said single post-processing chamber until said single post-processing chamber reaches a fourth pressure value;
  - increase the temperature in said single post-processing chamber to a third temperature value; and
  - performing a sulfurization process in said single post-processing chamber at the third temperature and fourth pressure value.

9. The apparatus of claim 8, wherein said controller is further configured to remove the residual gas generated during the sulfurization process.

10. The apparatus of claim 8, wherein said controller is further configured to add inert gas into said at least one post-processing chamber when the temperature in said post-processing chamber is increased to a value of half of the difference between a current temperature value and the second temperature value.

11. The apparatus of claim 8, wherein the first pressure value in a range of from about $10^{-1}$ torr to about $10^{-4}$ torr and the second pressure value is in the range of from about 130 torr to about 520 torr, and wherein the first temperature value is at room temperature.

12. The apparatus of claim 8, wherein the second temperature value is in the range of from about 370° C. to about 450° C.

13. The apparatus of claim 8, wherein the fourth pressure value is in the range of from about 200 torr to about 600 torr.

14. The apparatus of claim 8, wherein the third temperature value is in the range of from about 500° C. to about 650° C.

15. A method for forming thin film solar cell materials, said method comprising:
- introducing an inert gas into a single chamber at a first pressure value until the single chamber reaches a second pressure value and at a first temperature value;
- increasing the temperature in the single chamber to a value midway between a current temperature value and a second temperature value;
- adding a first inert gas mixture that includes hydrogen selenide into the single chamber when the value midway between the current temperature value and the second temperature value is reached;
- increasing the temperature in the single chamber to the second temperature value so that the pressure in the single chamber increases to a third pressure value;
- performing a selenization process at the second temperature and third pressure;
- adding a second inert gas mixture that includes hydrogen sulfide into the single chamber until the single chamber reaches a fourth pressure value;
- increasing the temperature in the single chamber to a third temperature value; and
- performing a sulfurization process in the single chamber at the third temperature.

16. The method of claim 15, further comprising removing the residual gas generated during the sulfurization process.

17. The method of claim 15, wherein introducing an inert gas comprises introducing an inert gas into the single chamber incrementally at a first pressure value in a range of from about $10^{-1}$ torr to about $10^{-4}$ torr until the single chamber reaches a second pressure value in the range of from about 100 torr to about 350 torr and at room temperature.

18. The method of claim 15, wherein increasing the temperature in the chamber to a value of half of the difference between a current temperature value and a second temperature value comprises increasing the temperature in the chamber to a value of from about 100° C. to about 300° C.

19. The method of claim 15, wherein adding a second inert gas mixture comprises adding a second inert gas mixture that includes hydrogen sulfide into the single chamber until the chamber reaches a fourth pressure value in the range of from about 200 torr to about 600 torr.

20. The method of claim 15, wherein increasing the temperature in the chamber to a third temperature value comprises increasing the temperature in the single chamber to a third temperature value in the range of from about 500° C. to about 650° C.

* * * * *